(12) United States Patent
Kitamura

(10) Patent No.: US 7,673,269 B2
(45) Date of Patent: Mar. 2, 2010

(54) AUTOMATIC TRACE DETERMINATION APPARATUS AND METHOD

(75) Inventor: Tamotsu Kitamura, Nagano (JP)

(73) Assignee: Shinko Electric Industries, Co., Ltd., Nagano (JP)

(*) Notice: Subject to any disclaimer, the term of this patent is extended or adjusted under 35 U.S.C. 154(b) by 403 days.

(21) Appl. No.: 11/440,679

(22) Filed: May 24, 2006

(65) Prior Publication Data

US 2006/0271898 A1 Nov. 30, 2006

(30) Foreign Application Priority Data

May 25, 2005 (JP) ............................. 2005-152805

(51) Int. Cl.
*G06F 17/50* (2006.01)

(52) U.S. Cl. .......................................... 716/12; 716/14

(58) Field of Classification Search ................... 716/12, 716/14, 2, 4
See application file for complete search history.

(56) References Cited

U.S. PATENT DOCUMENTS

| | | |
|---|---|---|
| 5,245,550 A | 9/1993 | Miki et al. |
| 5,644,500 A | 7/1997 | Miura et al. |
| 6,330,707 B1 | 12/2001 | Shinomiya et al. |
| 6,609,237 B1 | 8/2003 | Hamawaki et al. |

FOREIGN PATENT DOCUMENTS

| | | |
|---|---|---|
| JP | 10-209288 | 8/1998 |
| JP | 11-161694 | 6/1999 |
| JP | 2001-44288 | 2/2001 |
| JP | 2001-350813 | 12/2001 |

OTHER PUBLICATIONS

European Search Report dated Sep. 19, 2006.
J. Mitchell, Geometric Shortest Paths and Network Optimization, (Online), 1998, pp. 1-62, XP002389214, retrieved from the Internet.

(Continued)

*Primary Examiner*—Sun J Lin
(74) *Attorney, Agent, or Firm*—Locke Lord Bissell & Liddell LLP

(57) ABSTRACT

Automatic trace determination apparatus comprises: means for setting candidate starting route and candidate ending routes that are tangent to an obstacle existing on a straight line connecting between a starting point and an end point of a trace; means for, when a plurality of obstacles exist on the straight line, setting, with respect to each pair of two of the obstacles, straight routes, each of which is tangent only to such two obstacles and does not intersect with any obstacle other than such two obstacles; means for setting tentative routes, each of which includes any one of the candidate starting routes and any one of the candidate ending routes and, when the plurality of obstacles exist, may further include any of candidate intermediate routes selected with respect to each pair of the obstacles; and means for, among the tentative routes, determining the tentative route that has the shortest distance between the starting point and the end point as an optimal trace route.

20 Claims, 14 Drawing Sheets

OTHER PUBLICATIONS

K. Clarkson, Approximation Algorithms for Shortest Path Motion Planning, Conference proceedings of the annual ACM symposium on theory of computing 19$^{th}$, 1987 ACM, New York, NY, USA, 1987, pp. 56-65, XP002389215.

Sharir et al., On Shortest Paths in Polyhedral Spaces, Proceedings of the sixteenth annual ACM symposium on theory of computing, 1984, pp. 144-153, XP002389216.

Kapoor et al., Efficient Algorithms for Euclidean Shortest Path and Visibility Problems with Polygonal Obstacles, Proceedings of the fourth annual symposium on computational geometry ACM New York, USA, 1988, pp. 172-182, XP002389217.

Ali et al., A 2-D and 3-D robot Path Planning Algorithm Based on Quatree and Octree Representation of Workspace, IEEE, Apr. 11, 1988, pp. 391-396, XP010075194.

Suh et al., A Variation Dynamic Programming Approach to Robot-path Planning with a Distance-safety Criterion, IEEE Journal of Robotics and Automation USA, vol. 4, No. 3, Jun. 1988, pp. 334-349, XP002389279.

T. Dayan, Rubber-band Based Topological Router, front page and pp. 9-27, (Online) 1997, XP002389280, Santa Cruz retrieved from the Internet.

Horowitz et al., Exercises, Computer Algorithms, Computer Science Press, New York, NY, 1998, pp. 241-275, XP002392397.

AUTOMATIC TRACE DETERMINATION APPARATUS AND METHOD

BACKGROUND OF THE INVENTION

1. Field of the Invention

The present invention relates to an automatic trace determination apparatus and an automatic trace determination method for determining trace routes, on a substrate and that do not intersect with obstacles on the substrate, automatically by computation, as well as to a computer program for allowing a computer to perform this automatic trace determination process.

2. Description of the Related Art

For example, in semiconductor integrated circuits such as LSIs (large-scale integrated circuits), PCBs (printed-circuit boards) and the like, as a typical example of a trace route search method for automatically providing traces without intersection with obstacles existing on a substrate, a method called a labyrinth search method is described, for example, in Japanese Unexamined Patent Publication No. H11-161694, Japanese Unexamined Patent Publication No. 2001-350813, Japanese Unexamined Patent Publication No. 2001-044288, and Japanese Unexamined Patent Publication No. H10-209288.

In the labyrinth search method, trace routes on a substrate are set so as to secure clearance from other traces or obstacles and so as not to intersect with the obstacles by diverting the trace route around such obstacles at 90 degrees or, in some cases, 45 degrees, which is an angle formed by the trace route and the verge of the substrate. Such a setting technique can be implemented, in particular, for LSIs, PCBs and the like, which have peculiar pattern characteristics in that disposed positions and the shapes of the obstacles in the LSIs, PCBs and the like have a certain regularity.

On substrates of PBGA, EBGA and the like semiconductor packages, there exist a large number of elements, such as planes, gates, marks, internal components or other traces in the packages, and so on, that may obstruct the traces and the shapes and the disposed positions or angles of such obstacles may vary significantly. Further, vias, balls, bonding pads (B/P), flip chip pads (F/C) or the like, which are to be starting or end points of the traces, may be positioned variously. Therefore, in trace design for the semiconductor packages, when the obstacles on the substrate are bypassed, the trace routes have to be diverted around the obstacles at arbitrary angles formed by the trace route and the verge of the substrate, which are not limited to 90 or 45 degrees. Thus, the labyrinth search method that has been conventionally used for automatic wiring in the LSI, PCB and the like cannot be applied to automatic wiring of the semiconductor packages.

In view of such circumstances, in the trace design of semiconductor packages, a designer typically designs the trace routes of the semiconductor packages on a virtual plane by trial and error depending on the designer's skill, experience and intuition, for example, by using a CAD system. In such manual trace design by trial and error, as the required traces become more complicated, the effort, time and difficulty for achieving the optimal traces is increased. Further, unevenness in quality of finished products is also increased. In reality, because the manual trace design by trial and error requires at least more than ten hours' work and it is not economical to spend more time on trace designing, the designer has to compromise with a certain design quality. As the semiconductor packages are miniaturized and integrated, automatization of trace design of the semiconductor packages will be one of the most important tasks in the future.

In view of the above problems, it is an object of the present invention to provide an automatic trace determination apparatus and an automatic trace determination method that can determine trace routes on a substrate, that do not intersect with obstacles on the substrate, automatically and in a short time, as well as a computer program for allowing a computer to perform this automatic trace determination process.

SUMMARY OF THE INVENTION

In order to achieve the above object, according to the present invention, when an obstacle exists on a straight line connecting between two points that are to be a starting point and an end point of a trace, first, tentative routes, each of which includes at least a straight route from the starting point that is tangent to the obstacle and a straight route from the end point that is tangent to the obstacle, are set. In particular, when a plurality of obstacles exist on the straight line between the two points that are to be the starting point and the end point of the trace, each of the tentative routes further includes a straight route that is tangent only to two of the obstacles and does not intersect with any obstacle other than such two obstacles. Here, the straight routes that are tangent to two of the obstacles are set with respect to each pair of the two of the obstacles. Among a plurality of the set tentative routes, the tentative route that has the shortest distance between the starting point and the end point of the trace is determined as an optimal trace route.

FIG. 1 is a principle block diagram of an automatic trace determination apparatus according to the present invention.

An automatic trace determination apparatus 1 for determining a trace route on a substrate, that does not intersect with at least one obstacle on the substrate, automatically by computation comprises:

first candidate route setting means 11 for, when the obstacle exists on a straight line connecting between two points that are to be a starting point and an end point of a trace, setting straight routes from the starting point that is tangent to the obstacle as candidate starting routes and setting straight routes from the end point that is tangent to the obstacle as candidate ending routes;

second candidate route setting means 12 for, when a plurality of obstacles exist on the straight line connecting between the two points that are to be the starting point and the end point of the trace, setting, with respect to each pair of two of the obstacles, straight routes, each of which is tangent only to the two obstacles and does not intersect with any obstacle other than such two obstacles as candidate intermediate routes;

tentative route setting means 13 for setting tentative routes, each of which includes at least any one of the candidate starting routes and any one of the candidate ending routes and, when the plurality of obstacles exist on the straight line connecting between the two points that are to be the starting point and the end point of the trace, may further include any one of the candidate intermediate routes selected with respect to each pair of the two of the obstacles; and optimal route determination means 14 for, among the tentative routes set by the tentative route setting means 13, determining the tentative route that has the shortest distance between the starting point and the end point as an optimal trace route.

According to the present invention, it is preferable that the automatic trace determination apparatus further comprises decision means (not shown) for deciding whether the obstacle exists or not on the straight line connecting between the two points that are to be the starting point and the end point of the trace on the substrate. When the obstacle exists on the straight line connecting between the two points that are to be the starting point and the end point of the trace, obstacle information is input to the first candidate route setting means 11 and, based on such obstacle information and trace design data, the first candidate route setting means 11 sets the candidate starting routes and the candidate ending routes. In particular, when the plurality of obstacles exist on the straight line connecting between the two points that are to be the starting point and the end point of the trace, the obstacle information is input not only to the first candidate route setting means 11 but also to the second candidate route setting means 12 and, based on such obstacle information and trace position data, the first candidate route setting means 11 sets the candidate starting routes and the candidate ending routes and the second candidate route setting means 12 sets the candidate intermediate routes.

Further, once the optimal route is determined by the optimal route determination means 14, it is preferable that the optimal route is corrected so that clearance between such an optimal route and the obstacle can be secured. Still further, as a variation of this, before the first candidate route setting means 11, the second candidate route setting means 12, the tentative route setting means 13 and the optimal route determination means 14 operate, the clearance to be secured may be taken into account in advance and, then, the above-mentioned processes may be performed. In this case, the automatic trace determination means may further comprise virtual obstacle setting means (not shown) for setting a virtual obstacle by enlarging the obstacle existing on the straight line connecting between the two points that are to be the starting point and the end point of the trace to take a predetermined clearance into account. In place of the obstacle information described above, virtual obstacle information from the virtual obstacle setting means is input to the first candidate route setting means 11 and the second candidate route setting means 12. Based on the virtual obstacle information and trace design data, the first candidate route setting means 11 sets the candidate starting routes and the candidate ending routes and the second candidate route setting means 12 sets the candidate intermediate routes.

Further, when the optimal route determined by the optimal route determination means 14 intersects with an obstacle other than the obstacle bypassed by such optimal route, a point on such optimal route in the neighborhood of the obstacle bypassed by such optimal route is set as a new starting point of the trace to further perform the processes by the first candidate route setting means 11, the second candidate route setting means 12, the candidate tentative route setting means 13 and the optimal route determination means 14. The above-mentioned point on such optimal route in the neighborhood of the obstacle bypassed by such optimal route that is set as the new starting point of the trace is, for example, a point of contact between the optimal route and the obstacle concerned.

In this connection, the first candidate route setting means 11, the second candidate route setting means 12, the tentative route setting means 13, the optimal route determination means 14, the decision means and the virtual obstacle setting means in the automatic trace determination apparatus 1 can be implemented in the form of a software program that can be operated by an arithmetic processing unit such as a computer.

BRIEF DESCRIPTION OF THE DRAWINGS

The present invention will be more clearly understood from the description as set below with reference to the accompanying drawings, wherein.

DESCRIPTION OF THE PREFERRED EMBODIMENTS

Figure 1:
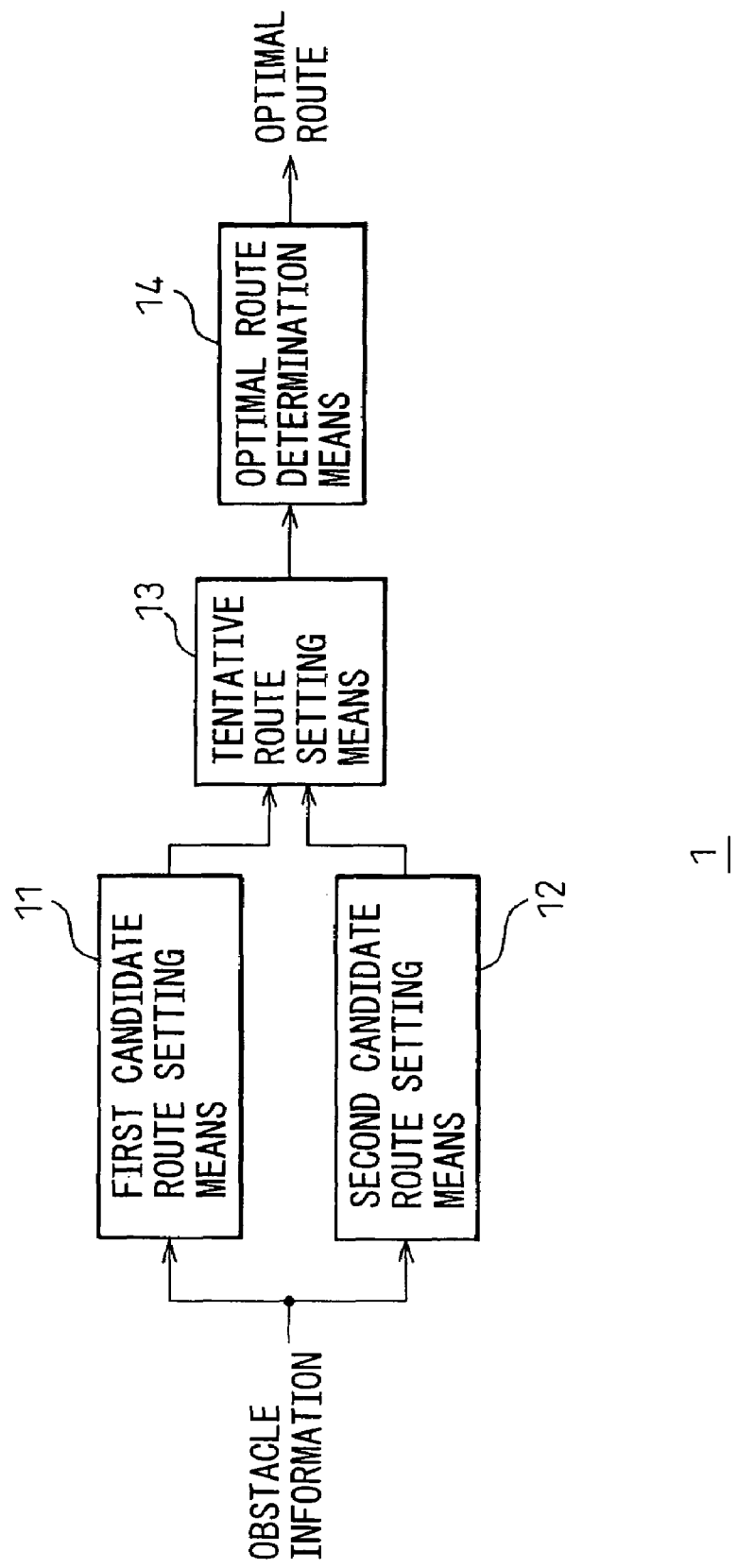
FIG. 1 is a principle block diagram of an automatic trace determination apparatus according to the present invention.
Figure 2:
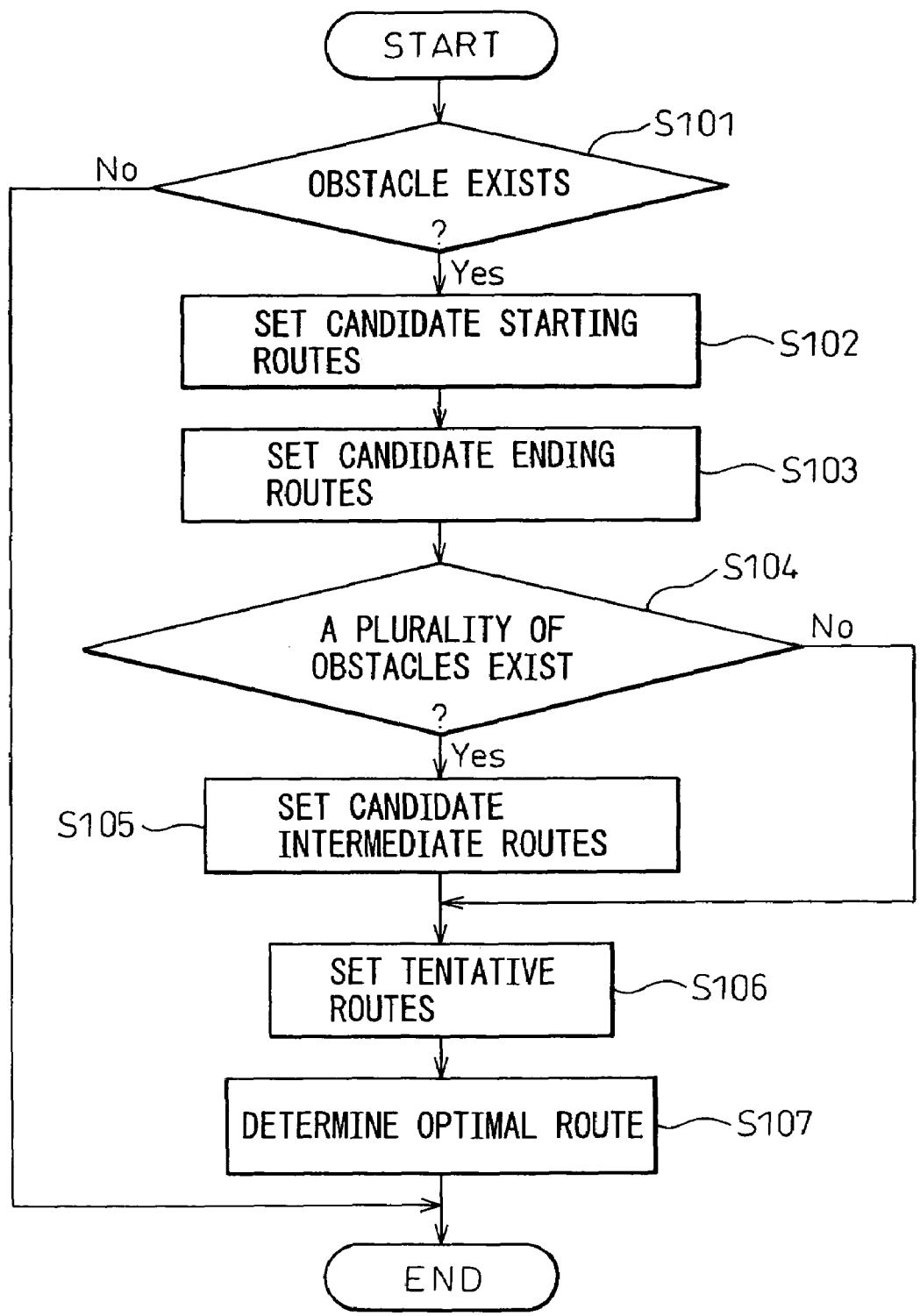
FIG. 2 is a flow chart showing an operational flow of an automatic trace determination method according to an embodiment of the present invention.

FIG. 2 is a flow chart showing an operational flow of an automatic trace determination method according to an embodiment of the present invention.

First, in step S101, when a trace is intended to be disposed on a substrate, assuming a straight line connecting between two points that are to be a starting point and an end point of this trace, it is decided whether at least one obstacle exists on this straight line or not.

In step S101, if it is decided that the at least one obstacle exists on the straight line connecting between the two points that are to be the starting point and the end point of the trace, in step S102, straight routes that are tangent to such obstacle from the above-mentioned starting point of the trace are set as candidate starting routes. It can be said that the candidate starting routes are tangential lines from one point to one object and, therefore, at least two candidate routes should exist.

Then, in step S103, straight routes that are tangent to such an obstacle from the above-mentioned end point of the trace are set as candidate ending routes. Similarly to the candidate starting routes described above, at least two candidate ending routes should exist. Here, the above-mentioned steps S102 and S103 may be performed in a reversed order.

Next, in step S104, it is decided whether a plurality of obstacles exist on the straight line connecting between the two points that are to be the starting point and the end point of the trace or not. If it is decided that a plurality of obstacles exist on the straight line connecting between the two points that are to be the starting point and the end point of the trace, the process proceeds to step S105 and, if only one obstacle exists, the process proceeds to step S106. Here, a process for deciding whether the plurality of obstacles exist or not in step S104 may be included in the process for deciding existence of the at least one obstacle in step S101 and these processes may be performed simultaneously. In this case, when it is decided that at least one obstacle exists, information about the number of obstacles may be stored and, after steps S102 and S103 are performed, based on the information about the number of obstacles, it may be determined whether to perform step S105 or perform step S106 while not performing step S105.

In step S105, straight routes that are tangent to only two obstacles and that do not intersect with any obstacle other than such two obstacles are set as candidate intermediate routes. Here, because it is decided that the plurality of obstacles exist in step S104, it is apparent that one or more pairs of the "two obstacles" exist. The candidate intermediate routes set in step S105 are generated for each pair of the two obstacles selected from the plurality of obstacles.

Next, in step S106, tentative routes, each of which includes at least any one of the candidate starting routes and any one of the candidate ending routes, are set. In particular, when the plurality of obstacles exist on the straight line connecting between the two points that are to be the starting point and the end point of the trace, each of the tentative routes further includes "any one of the candidate intermediate routes" selected for each pair of the two obstacles as described above. For example, when two obstacles exist and, therefore, one pair of two adjacent obstacles exists, "any one of the candidate intermediate routes" for such one pair is included in the tentative routes. Further, for example, when three obstacles exist, two pairs of two adjacent obstacles and one pair of two obstacles located on both sides of one obstacle exist. In this case, the candidate intermediate routes with respect to the two pairs of two adjacent obstacles exist absolutely but, with respect to the one pair of two obstacles located on both sides of one obstacle, the candidate intermediate routes may not exist, for example, in the case such as when the obstacle located between the two obstacles is very large. Thus, when three obstacles exist, "any one of the candidate intermediate routes" with respect to each of at least two pairs is included in the tentative routes.

The process in step S106 described above may be summarized as follows. Thus, in step S106, when one obstacle exists on the straight line connecting between the two points that are to be the starting point and the end point of the trace, any one of the candidate starting routes and any one of the candidate ending routes are combined together and set as the tentative routes. When a plurality of obstacles exist on the straight line connecting between the two points that are to be the starting point and the end point, any one of the candidate starting routes, any one of the candidate ending routes, and any one of the candidate intermediate routes selected with respect to each pair of obstacles are combined together and set as the tentative routes.

Then, in step S107, among the plurality of tentative routes obtained in step S106, the tentative route having the shortest distance between the two points that are to be the starting point and the end point is determined as an optimal trace route.

When the optimal route determined in step S107 intersects with any virtual obstacle other than said virtual obstacles bypassed by such optimal route, a point on such optimal route in the neighborhood of the virtual obstacles bypassed by such optimal route is set as a new starting point of the trace to further perform the above-mentioned process. The point on the above-mentioned optimal route in the neighborhood of the obstacles by such optimal route that is set as the new starting point of the trace is, for example, a point of contact between the optimal route and the obstacle concerned.

The processes of the steps S101-S107 in the automatic trace determination process according to an embodiment of the present invention are performed by a processor such as a computer. In this connection, before starting the step S101, it is preferable that information about elements that may obstruct the trace, such as planes, gates, marks, internal components or other traces in a package and so on or, in particular, information about shapes, disposed positions or angles of the obstacles and various data about vias, balls, bonding pads (B/P) or flip chip pads (F/C), design data, rules for clearance and the like is input to the processor in advance. The above-mentioned processor uses the above-mentioned input data to start the process from step S101. Through steps S101-S107, the optimal route position of the trace that does not intersect with the obstacles existing on the substrate is determined automatically by computation.

Hereinafter, several specific examples will be shown. In the specific examples shown here, it is assumed that obstacles have polygonal shapes but, even when the shapes of the obstacles include curved portions, the present invention may be applied similarly.

FIGS. 3-7 are diagrams for describing a first specific example of determination of an optimal trace route by an automatic trace determination apparatus in an embodiment of the present invention.

Figure 3:
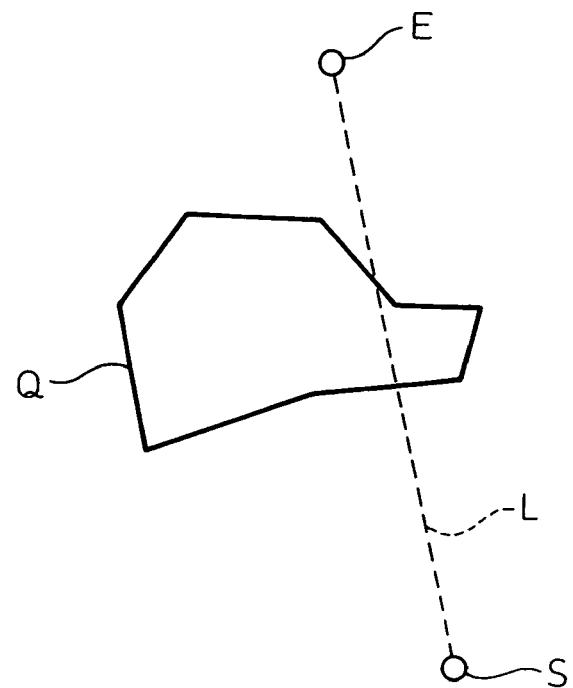
FIGS. 3 to 7 are diagrams for describing a first specific example of determination of an optimal trace route by an automatic trace determination apparatus in an embodiment of the present invention.

In the first specific example, as shown in FIG. 3, it is assumed that one obstacle Q exists between a point S, which is to be a starting point of a trace, and a point E, which is to be an end point.

Figure 4:
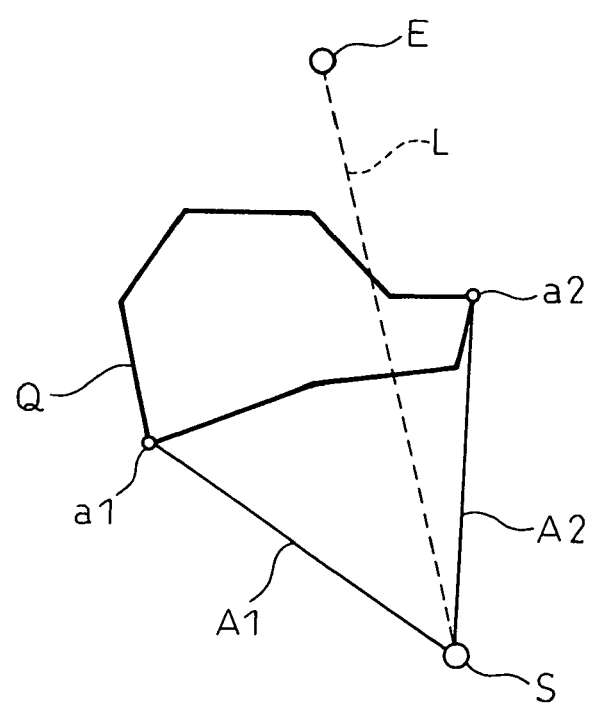

As shown in FIG. 3, when the obstacle Q exists on a straight line L connecting between the starting point S and the end point E, first, as shown in FIG. 4, straight routes that are tangent to the obstacle Q from the starting point S of the trace are set as candidate starting routes. More specifically, the candidate starting routes A1 and A2 that are set with respect to the obstacle Q having the polygonal shape are straight routes that intersect with the obstacle Q only at vertexes a1 and a2, respectively, among those that pass through various vertexes of the obstacle Q from the starting point S.

Figure 5:
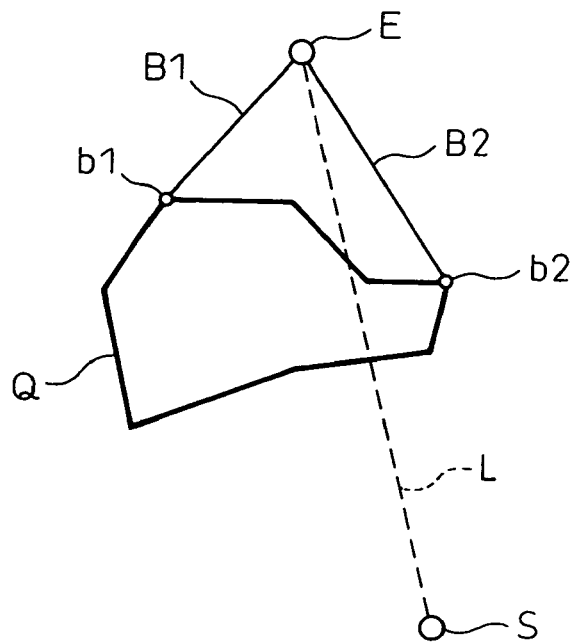

Further, as shown in FIG. 5, straight routes that are tangent to the obstacle Q from the end point E of the trace are set as candidate ending routes. More specifically, the candidate ending routes B1 and B2 that are set with respect to the obstacle Q having a polygonal shape are straight routes that intersect with the obstacle Q only at vertexes b1 and b2, respectively, among those that pass through various vertexes of the obstacle Q from the end point E.

Figure 6:
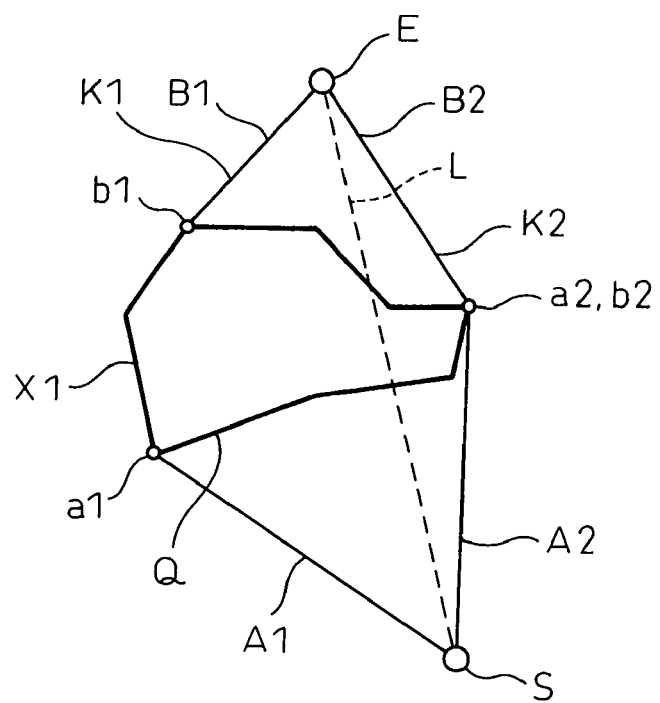

In the first specific example, only one obstacle Q exists on the straight line L connecting between the starting point S and the end point E of the trace and, therefore, candidate intermediate routes are not generated. In the process up to this point, as shown in FIG. 6, the candidate starting routes A1 and A2 and the candidate ending routes B1 and B2 are obtained with respect to the one obstacle Q.

Next, tentative routes are set so that each of the tentative routes includes any one of the candidate starting routes A1 and A2 and any one of the candidate ending routes B1 and B2. In the example shown in FIG. 6, a tentative route K1 consisting of the candidate starting route A1, the candidate ending route B1 and a candidate route X1 connecting between A1 and B1 along the obstacle Q, and a tentative route K2 consisting of the candidate starting route A2 and the candidate ending route B2 are set. Here, for example, a tentative route including the candidate ending route B1 and the candidate starting route A2 is not set, because the distance from the starting point S to the end point E of such tentative route is longer than the distance from the starting point S to the end point E of the tentative route K2.

Figure 7:
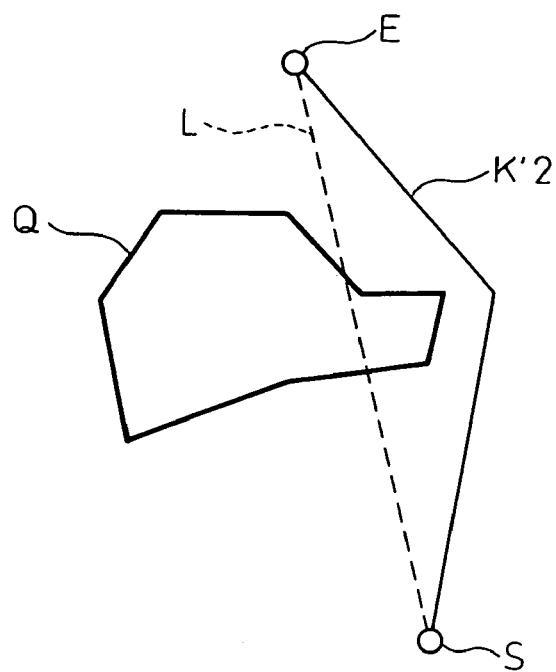

As described above, the tentative routes K1 and K2 are obtained with respect to the one obstacle Q. Therefore, next, the lengths of the tentative routes K1 and K2 between the two points that are to be the starting point S and the end point E of the trace are compared. In the shown example, the tentative route K2, which is shorter than the tentative route K1, is determined as an optimal trace route. Here, up to this point, requirements for clearance of the trace are not taken into account. Therefore, the optimal route obtained as described above is corrected so that the clearance between such optimal route and the obstacle can be secured to eventually obtain an optimal route K'2 of the trace as shown in FIG. 7.

Figure 8:
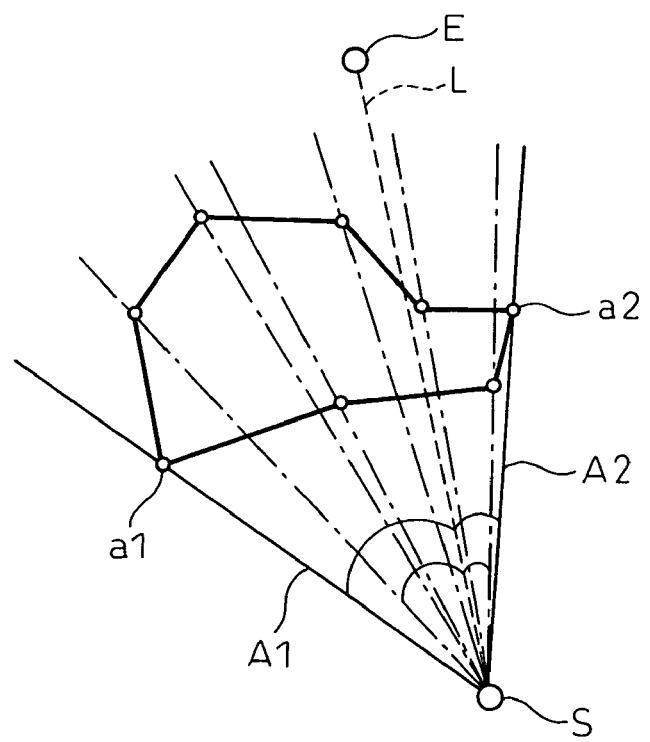
FIG. 8 is a diagram for describing a specific example of a process for deriving candidate starting routes with respect to an obstacle having a polygonal shape in an embodiment of the present invention.

The specific example of the process for deriving the candidate starting routes described with reference to FIG. 4 and the process for deriving the candidate ending routes described with reference to FIG. 5 will be described as follows. FIG. 8 is a diagram for describing a specific example of a process for deriving candidate starting routes with respect to an obstacle having a polygonal shape in an embodiment of the present invention, and FIG. 9 is a diagram for describing a process for deriving candidate ending routes with respect to an obstacle having a polygonal shape in an embodiment of the present invention.

As shown in FIG. 8, first, a straight line L connecting between a starting point S and an end point E is set as an intersection check reference line. This intersection check reference line L is a straight line that divides an obstacle having a polygonal shape into left and right parts. With respect to the both left and right parts divided by this intersection check reference line L, angles between each straight route passing through each vertex of the obstacle Q from the starting point S and the intersection check reference line L are checked. In the figure, a straight route A1 on the left side of the intersection check reference line L and a straight route A2 on the right side of the intersection check reference line L form the largest angles with the intersection check reference line L and, therefore, these are determined as candidate starting routes.

Figure 9:
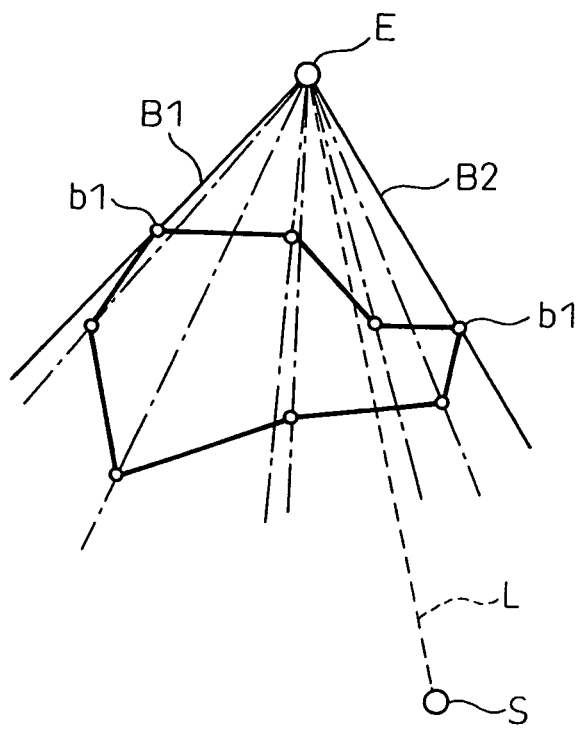
FIG. 9 is a diagram for describing a specific example of a process for deriving candidate ending routes with respect to an obstacle having a polygonal shape in an embodiment of the present invention.

Similarly, as shown in FIG. 9, first, the straight line L connecting between the starting point S and the end point E is set as the intersection check reference line. This intersection check reference line L is a straight line that divides the obstacle Q into the left and right parts and, with respect to the both left and right parts divided by this intersection check reference line L, angles between each straight route passing through each vertex of the obstacle Q from the end point E and the intersection check reference line L are checked. In the figure, a straight route B1 on the left side of the intersection check reference line L and a straight route B2 on the right side of the intersection check reference line L form the largest angles with the intersection check reference line L and, therefore, these are determined as candidate ending routes.

In a technique commonly used in the related art, check straight lines are drawn for each line segment of an obstacle having a polygonal shape and the number of intersections between the check straight lines and such obstacle is calculated for each line segment to derive a route bypassing the obstacle. At this time, an amount of computation is proportional to the product of a factorial of the number of the line segments of the obstacle and a factorial of the number of the check straight lines. In contrast, in this embodiment, as described above with reference to FIGS. 8 and 9, the candidate starting routes and the candidate ending routes are derived by finding the straight routes that form the largest angles with the intersection check reference line L. At this time, an amount of computation is proportional to the number of the line segments of the obstacle. Thus, the technique used in this embodiment requires less computation and, therefore, it is more advantageous than that commonly used in the related art.

FIGS. 10-15 are diagrams for describing a second specific example of determination of an optimal trace route by an automatic trace determination apparatus in an embodiment of the present invention.

Figure 10:
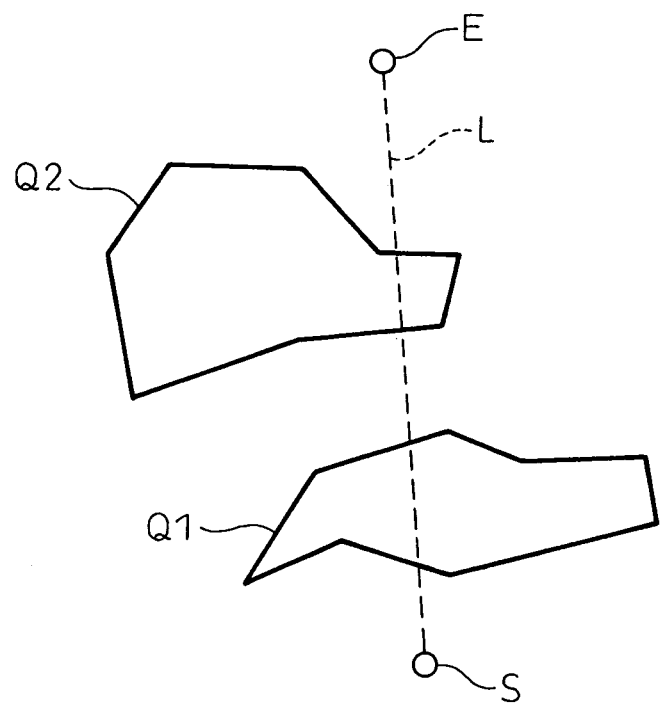
FIGS. 10 to 15 are diagrams for describing a second specific example of determination of an optimal trace route by an automatic trace determination apparatus in an embodiment of the present invention.

In the second specific example, as shown in FIG. 10, it is assumed that a plurality of (in particular, two in this figure) obstacles Q1 and Q2 exist between a point S, which is to be a starting point of a trace, and a point E, which is to be an end point. Here, it is assumed that the obstacles Q1 and Q2 have polygonal shapes.

Figure 11:
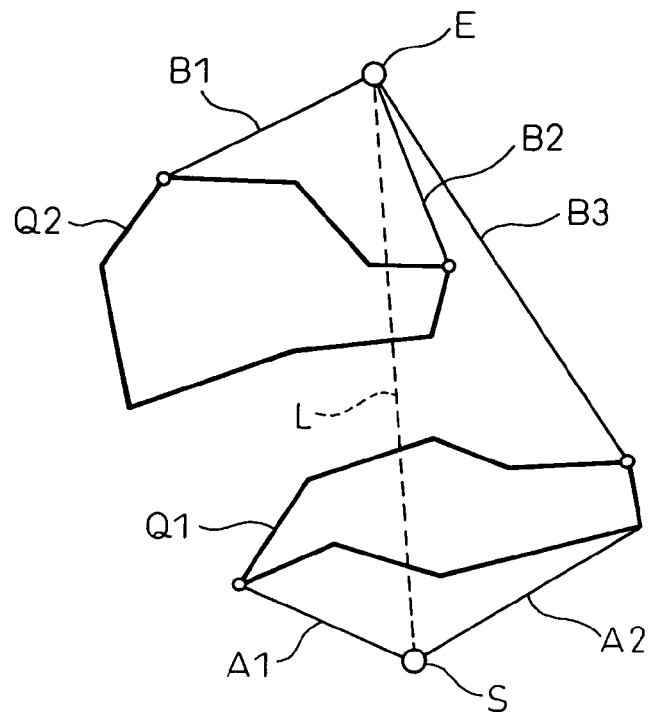

As shown in FIG. 10, when the obstacles Q1 and Q2 exist on a straight line L connecting between the starting point S and the end point E, as shown in FIG. 11, candidate starting routes A1 and A2 and candidate ending routes B1 and B2 are set. The specific process for deriving the candidate starting routes and the candidate ending routes has already been described above.

Figure 12:
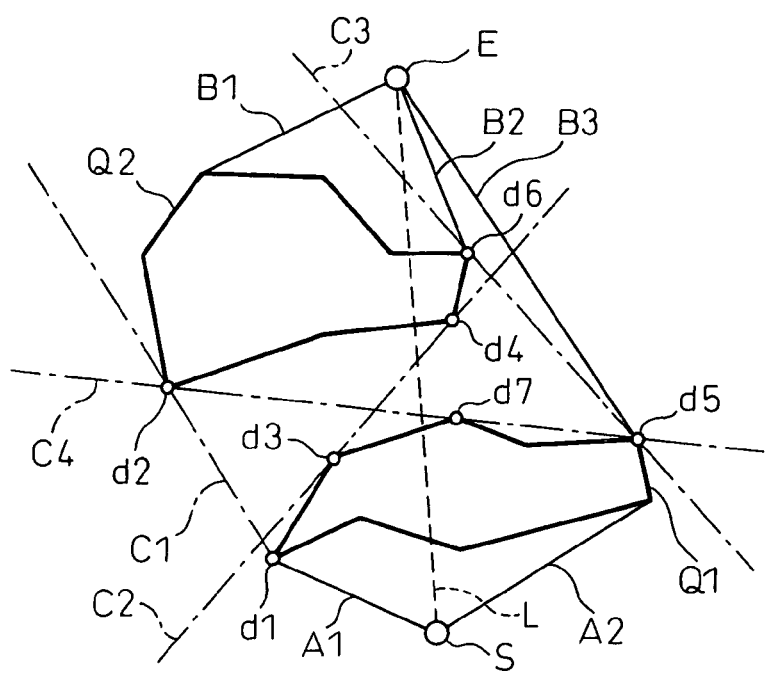

In this specific example, a plurality (two in the shown example) of obstacles exist on the straight line L connecting between the two points, which are to be the starting point S and the end point E of the trace and, therefore, as shown in FIG. 12, straight routes that are tangent only to the two obstacles Q1 and Q2 and that do not intersect with any obstacle other than such two obstacles Q1 and Q2 are set as candidate intermediate routes. More specifically, the candidate intermediate routes C1, C2, C3 and C4 that are set with respect to the obstacles Q1 and Q2 having the polygonal shapes are straight routes that intersect with such the two obstacles Q1 and Q2 only at vertexes d1, d2, d3, d4, d5, d6 and d7 and that do not intersect with any obstacle other than such two obstacles Q1 and Q2, among those that pass through various vertexes of such two obstacles Q1 and Q2.

In the process up to this point, as shown in FIG. 12, the candidate starting routes A1 and A2, the candidate intermediate routes C1, C2, C3 and C4, and the candidate ending routes B1 and B2 are obtained with respect to the two obstacles Q1 and Q2.

Next, tentative routes are set so that each of the tentative routes includes at least any one of the candidate starting routes A1 and A2 and any one of the candidate ending routes B1, B2 and B3. In particular, in this case in which the two obstacles Q1 and Q2 exist on the straight line L connecting between the two points that are to be the starting point S and the end point E of the trace, each of the tentative routes includes any one of the candidate starting routes A1 and A2, any one of the candidate ending routes B1 and B2 and, further, any one of the candidate intermediate routes C1, C2, C3 and C4 with respect to the two obstacles Q1 and Q2.

Here, as shown in FIG. 12, the candidate ending route B3 from the end point E is tangent not to the obstacle Q2 but to the obstacle Q1 at the vertex d5. The tentative route including the candidate starting route A2, the candidate intermediate route C3 and the candidate ending route B2, the tentative route including the candidate starting route A2, the candidate intermediate route C4 and the candidate ending route B1, and the tentative route including the candidate starting route A2 and the candidate ending route B3 pass through the vertex d5. While each of these tentative routes includes the candidate starting route A2, the vertex d5 of the obstacle Q1 and the end point E can be interconnected directly by the candidate ending route B3 with a shorter distance in comparison with the case in which these points are interconnected by the route via the candidate intermediate route C3 and the candidate ending route B2 or the route via the candidate intermediate route C4 and the candidate ending route B1. Based on the fact that it is preferable that the tentative route has the shortest length as described above, when the tentative routes are set, the candidate intermediate routes C3 and C4 passing through the vertex d5 are excluded from the elements of the tentative traces. Thus, at this stage, the unpreferable elements can be excluded in advance so as to reduce in advance the amount of computation of "the process for selecting the shortest tentative route" that will be performed after setting the tentative routes.

As described above, and as shown in FIG. 13, the candidate starting route A1 and A2, the candidate intermediate routes C1 and C2, and the candidate ending route B1, B2 and B3 are obtained with respect to the two obstacles Q1 and Q2.

Figure 14:
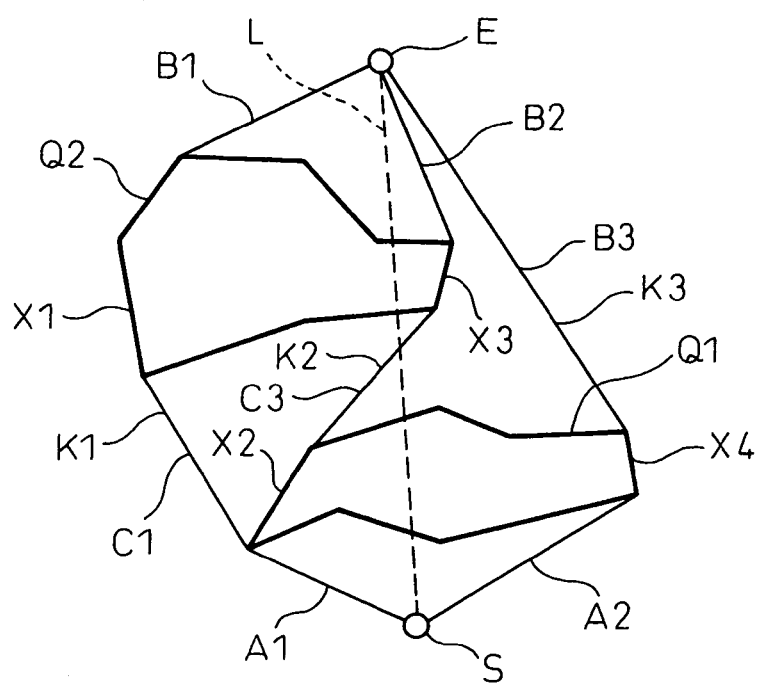

Next, candidate tentative routes are set by using these candidate starting routes, candidate intermediate routes and candidate ending routes. More specifically, as shown in FIG. 14, "a tentative route K1 consisting of: the candidate starting route A1; the candidate intermediate route C1; the candidate ending route B1; and a candidate route X1 connecting between the candidate intermediate route C1 and the candidate ending route B1 along the obstacle Q2", "a tentative route K2 consisting of: the candidate starting route A1; the candidate intermediate route C3: a candidate route X2 connecting between the candidate starting route A1 and the candidate intermediate route C3 along the obstacle Q1; the candidate ending route B2; and a candidate route X3 connecting between the candidate intermediate route C3 and the candidate ending route B2 along the obstacle Q2", and "a tentative route K3 consisting of: the candidate starting route A2; the candidate ending route B3; and a candidate route X4 connecting between the candidate starting route A2 and the candidate ending route B3 along the obstacle Q1" are set. Here, as described above, the tentative routes including the intermediate route C3 and the tentative routes including the intermediate route C4 are not set because distances from the starting point S to the end point E along such tentative routes are apparently longer than from the starting point S to the end point E along the tentative route K3.

Figure 15:
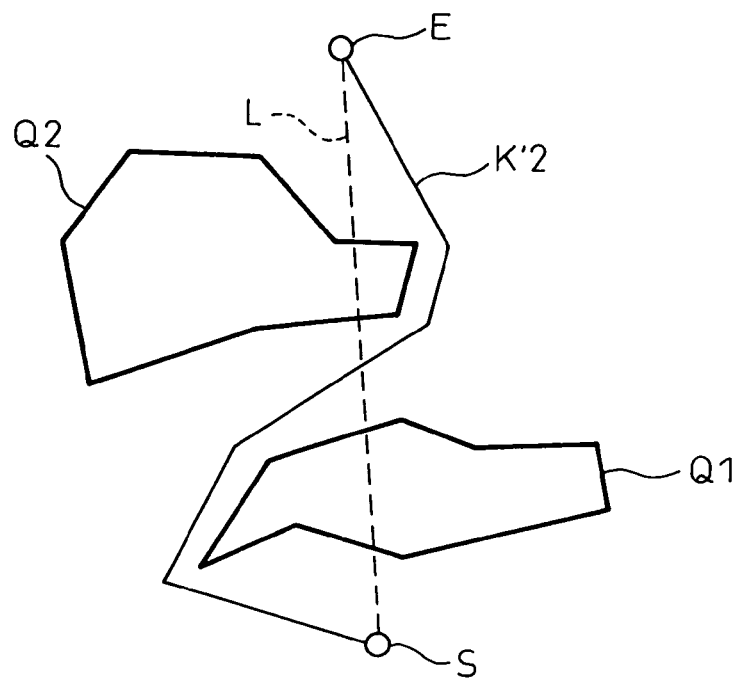

As described above, the tentative routes K1, K2 and K3 are obtained with respect to the two obstacles Q1 and Q2. Therefore, next, the lengths of the tentative routes K1, K2 and K3 between the two points that are to be the starting point S and the end point E of the trace are compared. In the shown example, the tentative route K2 is decided to be the shortest and it is determined as an optimal trace route. Here, up to this point, requirements for clearance of the trace are not taken into account. Therefore, the optimal route obtained as described above is corrected so that the clearance between such optimal route and the obstacle can be secured to eventually obtain an optimal route K'2 of the trace as shown in FIG. 15.

Figure 13:
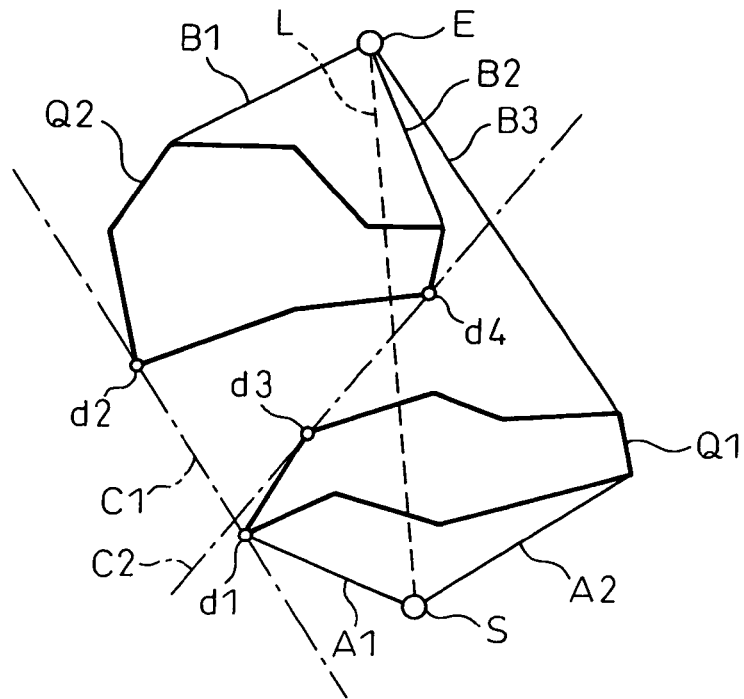

In this connection, as described with reference to FIGS. 12 and 13, in this specific example, when the tentative routes are set, the candidate intermediate routes C3 and C4 passing through the vertex d5 are excluded from the elements of the tentative routes in advance so as to further reduce the amount of computation. As an alternative to this, the tentative routes including the candidate intermediate routes C3 and C4 may be set and, then, the shortest tentative route may be selected from these tentative routes.

Figure 16:
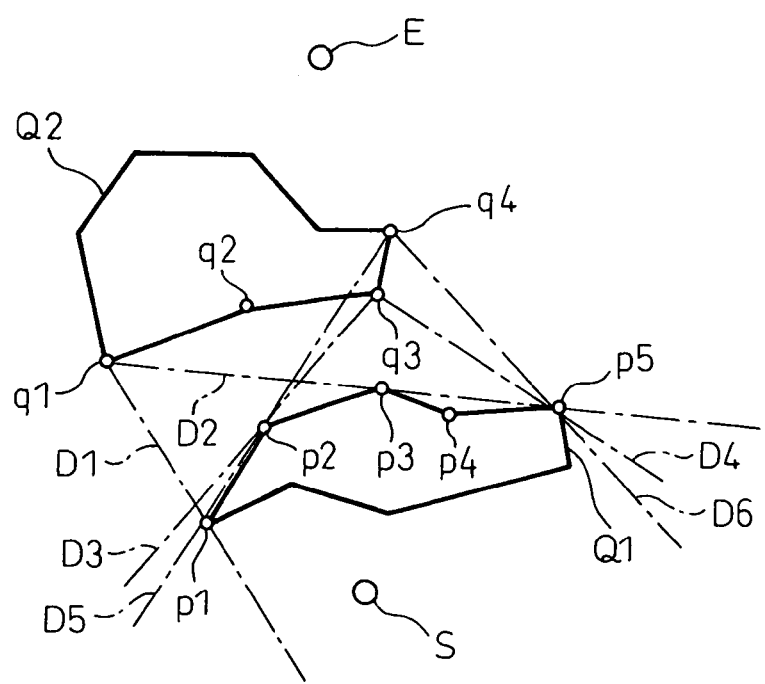
FIGS. 16 to 18 are diagrams for describing a specific example of a process for deriving candidate intermediate routes with respect to obstacles having polygonal shapes in an embodiment of the present invention.
Figure 17:
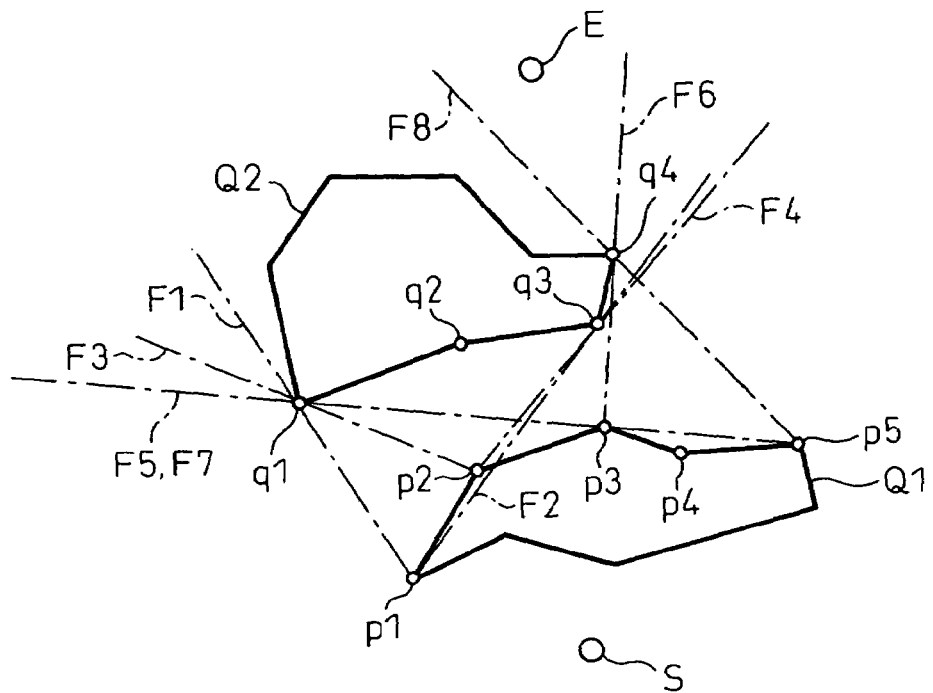
Figure 18:
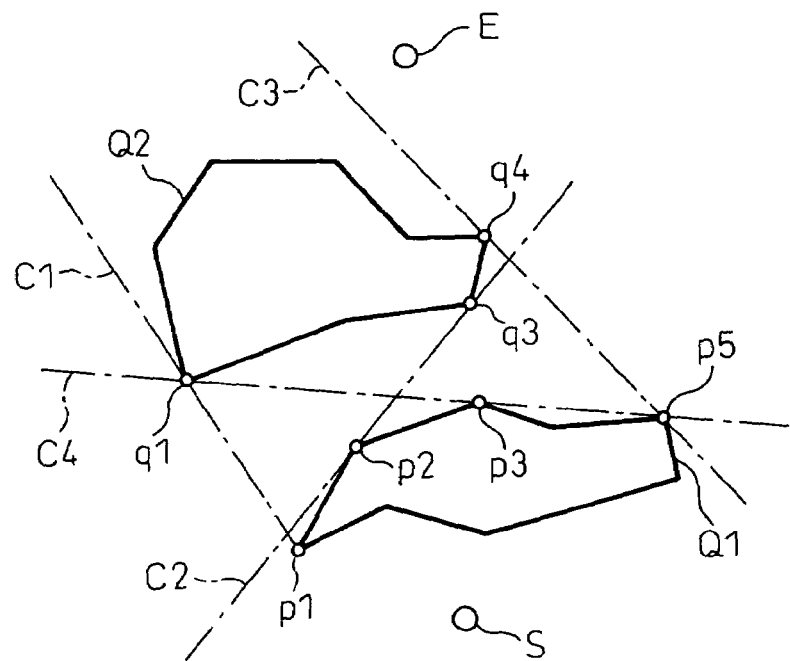

The specific example of the process for deriving the candidate intermediate routes described with reference to FIG. 12 will be described as follows. FIGS. 16-18 are diagrams for describing a process for deriving candidate intermediate routes with respect to obstacles having polygonal shapes in an embodiment of the present invention.

In this embodiment, when a plurality of obstacles having polygonal shapes exist, among straight routes passing through vertexes of two of the obstacles, straight routes that intersect only with such two obstacles only at the vertexes and do not intersect with any obstacle other than such two obstacles are set as candidate intermediate routes.

First, with respect to each of the two obstacles, among straight routes passing through the vertexes of one of the obstacles from the vertexes of the other of the obstacles, the straight routes that intersect only with such one obstacle only at the vertexes of such one obstacle are set as candidate tentative intermediate routes. At this time, the straight routes from concave vertexes of the obstacles are not included in the candidate tentative intermediate routes. This is because straight routes drawn from concave vertexes of an obstacle never satisfy requirements for "straight routes tangent to the obstacle".

For example, with respect to an obstacle Q1, as shown in FIG. 16, among straight routes passing through vertexes of the obstacle Q1 from vertexes q1, q3 and q4 of an obstacle Q2, straight routes D1, D2, D3, D4, D5 and D6 that intersect with the obstacle Q1 only at the vertexes of the obstacle Q1 (in the case of FIG. 16, the vertexes p1, p2, p3 and p5) are set as candidate tentative intermediate routes.

Similarly, with respect to the obstacle Q2, as shown in FIG. 17, among straight routes passing through vertexes of the obstacle Q2 from the vertexes p1, p2, p3 and p5 of the obstacle Q1, straight routes F1, F2, F3, F4, F5, F6, F7 and F8 that intersect with the obstacle Q2 only at the vertexes of the obstacle Q2 (in the case of FIG. 17, the vertexes q1, q3 and q4) are set as candidate tentative intermediate routes.

Here, the straight routes from a concave vertex p4 of the obstacle Q1 and from a concave vertex q2 of the obstacle Q2 never satisfy requirements for "straight routes tangent to the obstacle" and, therefore, these straight routes are not set as the candidate tentative intermediate routes.

Then, as shown in FIG. 18, among the candidate tentative intermediate routes D1, D2, D3, D4, D5, D6, F1, F2, F3, F4, F5, F6, F7 and F8, the candidate tentative intermediate routes D1 and F1, D3 and F4, D6 and F8, and D2 and F7, which are drawn from both of the two obstacles Q1 and Q2 (in other words, which are drawn from each of the two obstacles Q1 and Q2 and coincide with each other) are set as candidate intermediate routes C1, C2, C3 and C4.

FIGS. 19-23 are diagrams for describing a third specific example of determination of an optimal trace route by an automatic trace determination apparatus in an embodiment of the present invention.

Figure 19:
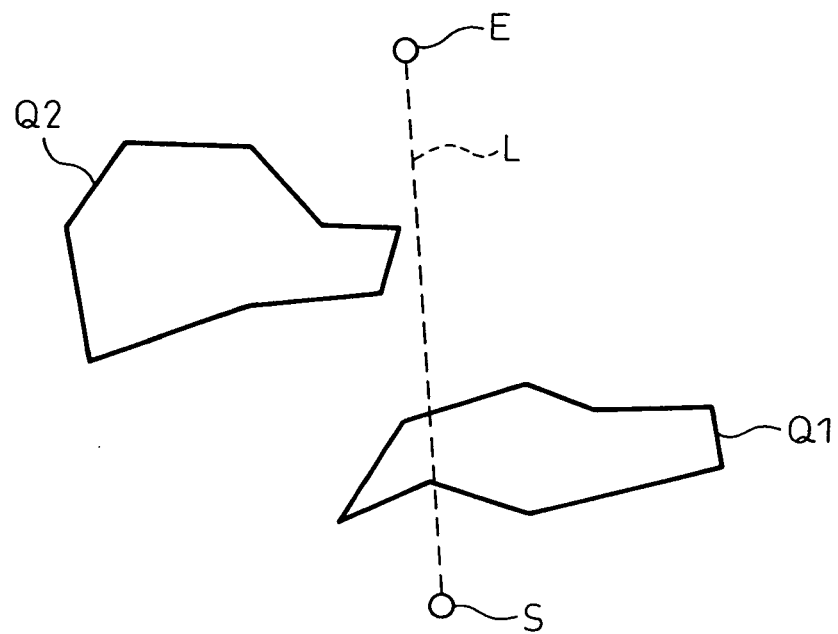
FIGS. 19 to 23 are diagrams for describing a third specific example of determination of an optimal trace route by an automatic trace determination apparatus in an embodiment of the present invention.
Figure 20:
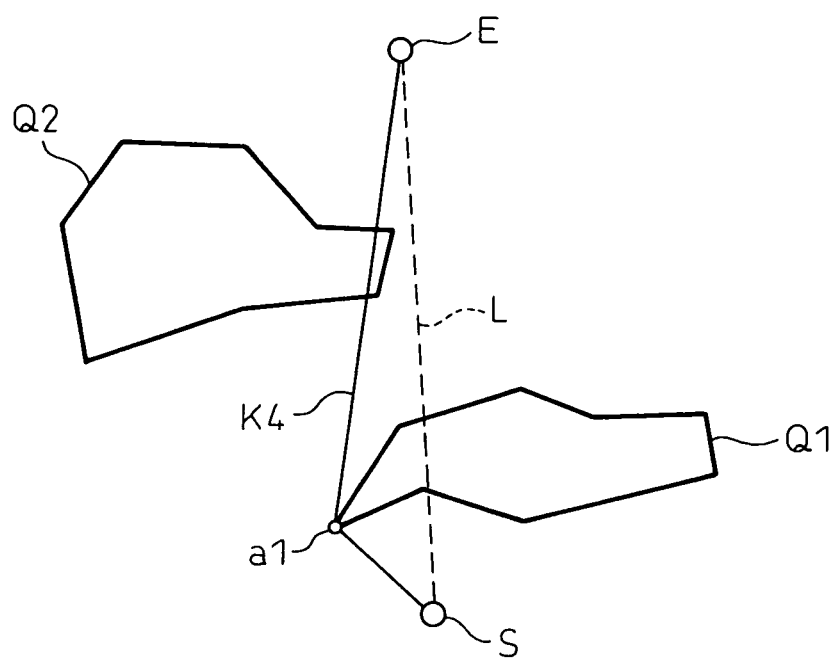

In the third specific example, as shown in FIG. 19, it is assumed that an obstacle Q1 exists on a straight line L connecting between a point S, which is to be a starting point of a trace, and a point E, which is to be an end point, and an obstacle Q2 exists in the neighborhood of this straight line L. Here, similarly to those in the embodiments described above, it is assumed that the obstacles Q1 and Q2 have polygonal shapes. In the case in which one obstacle exists on a straight line connecting between two points that are to be a starting point and an end point of a trace and, further, the other obstacle exists in the neighborhood of this straight line, even if an optimal route bypassing the one obstacle can be determined, this determined optimal route may, in turn, intersect with the other obstacle. When the determined optimal route intersects with the other obstacle newly, a point on the optimal route in the neighborhood of the obstacle bypassed by such optimal route is set as "a new starting point of a trace" to perform the processes for setting candidate routes, setting tentative routes and determining an optimal route described above again. The point on the optimal route in the neighborhood of the obstacle bypassed by such optimal route is, for example, a point of contact between the optimal route and the obstacle concerned. The above-mentioned processes are repeated till the obtained optimal route does not intersect with any obstacle on a substrate.

Figure 21:
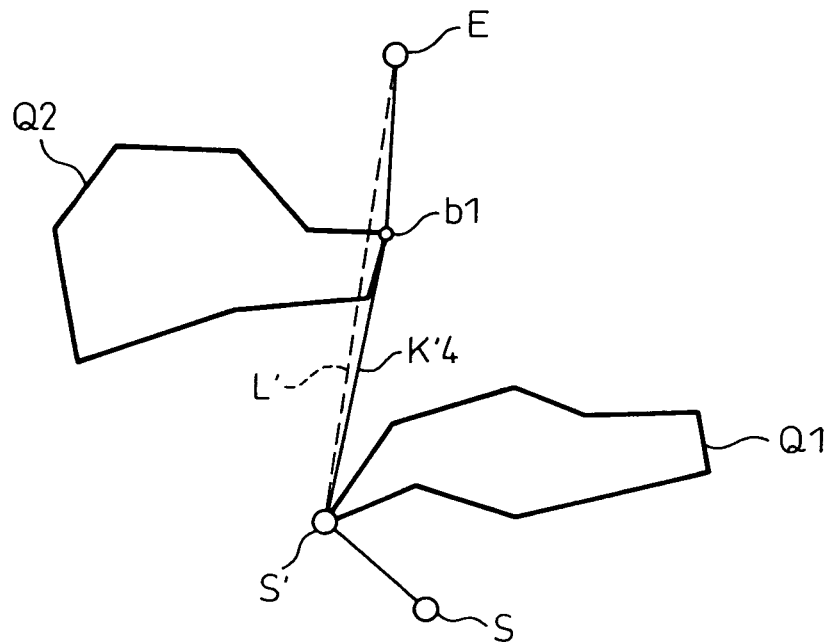
Figure 22:
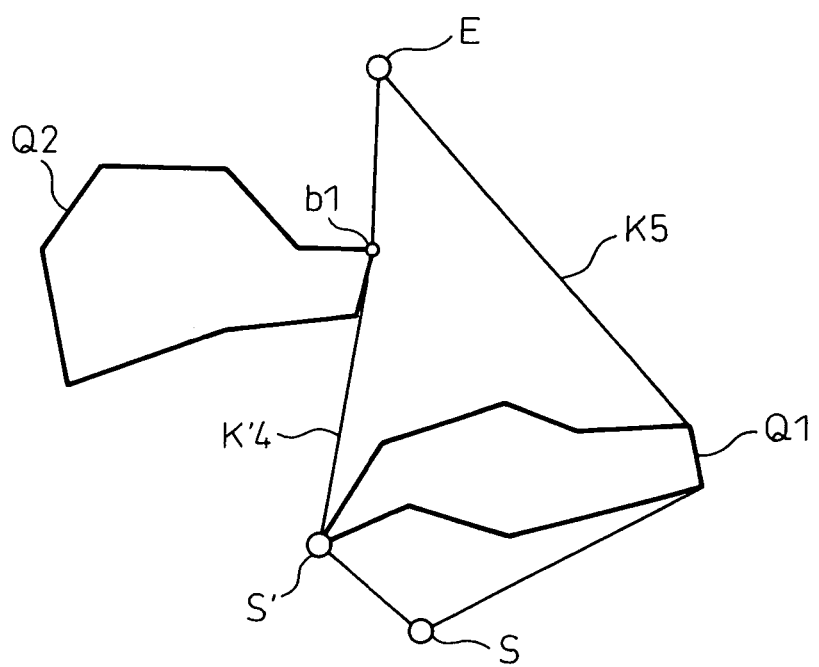

For example, in the specific example shown in FIG. 19, even if an optimal route K4 bypassing the obstacle Q1 is determined in a manner described above, this determined optimal route K4 will, in turn, intersect with the obstacle Q2 at a vertex b1. The obstacle Q2 exists on a straight line connecting between a vertex a1 of the obstacle Q1 bypassed by the optimal route K4 and the end point E. Therefore, as shown in FIG. 21, the vertex a1 of the obstacle Q1 is set as a new starting point S' of the trace and, then, an optimal route bypassing the obstacle Q2 that exists on a straight line L' connecting between the starting point S' and the end point E are determined by performing the processes for setting candidate routes, setting tentative routes and determining an optimal route described above again. An optimal route K'4 shown in FIG. 21 is determined newly.

Figure 23:
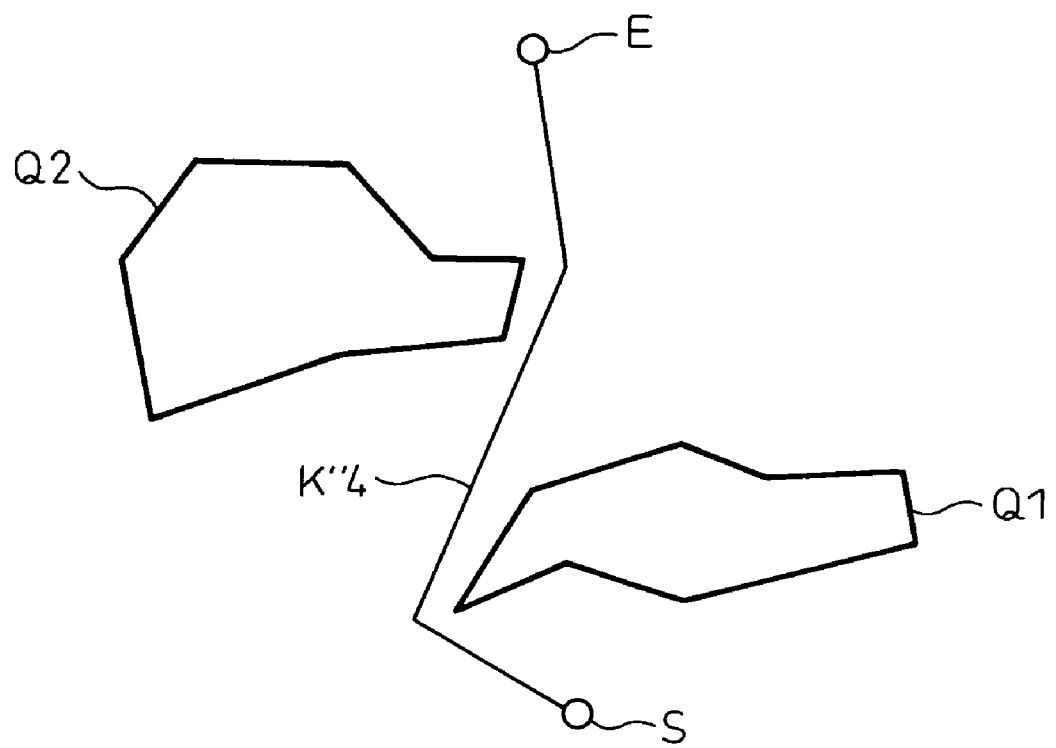

The optimal route K'4 connects between the starting point S and the end point E without intersection with the obstacles Q1 and Q2. However, other routes may connect between the starting point S and the end point E without intersection with the obstacles Q1 and Q2 and, for example, a route K5 shown in FIG. 22 may be one of such routes. Thus, when a plurality of routes may bypass the obstacles, among these routes, it is preferable to determine a route having the shortest distance from the starting point to the end point as an optimal route again. For example, in a specific example shown in FIG. 22, it is decided which has a shorter distance from the starting point and the end point of the route K'4 and the route K5. In this specific example, the route K'4, which is shorter than the route K5, is determined as an optimal trace route. Here, up to this point, requirements for clearance of the trace are not taken into account. Therefore, the optimal route K'4 obtained as described above is corrected so that the clearance between the optimal route K'4 and the obstacles Q1 and Q2 can be secured to eventually obtain an optimal route K"4 of the trace as shown in FIG. 23.

In the embodiments described above with reference to several specific examples, once an optimal route is determined, the optimal route is corrected so that the clearance between this optimal route and obstacles can be secured. As a variation of this, before performing processes for setting candidate routes, setting tentative routes and determining an optimal route, the clearance to be secured may be taken into account in advance and, then, the above-mentioned processes may be performed. In this case, obstacles existing on a straight line connecting between two points, which are to be a starting point and an end point of a trace, may be enlarged to take a predetermined clearance into account and such enlarged obstacles may be set as virtual obstacles and, then, the processes for setting the candidate routes, setting the tentative routes and determining the optimal route may be performed while replacing data about the obstacles with data about the above-mentioned virtual obstacles.

Further, an optimal route obtained according to the present invention consists of a plurality of successive straight-line segments. However, when a trace is provided actually based on such optimal route, it is preferable that sharp corners between the straight-line segments curve smoothly in terms of electrical characteristics and durability of the trace.

Figure 24:
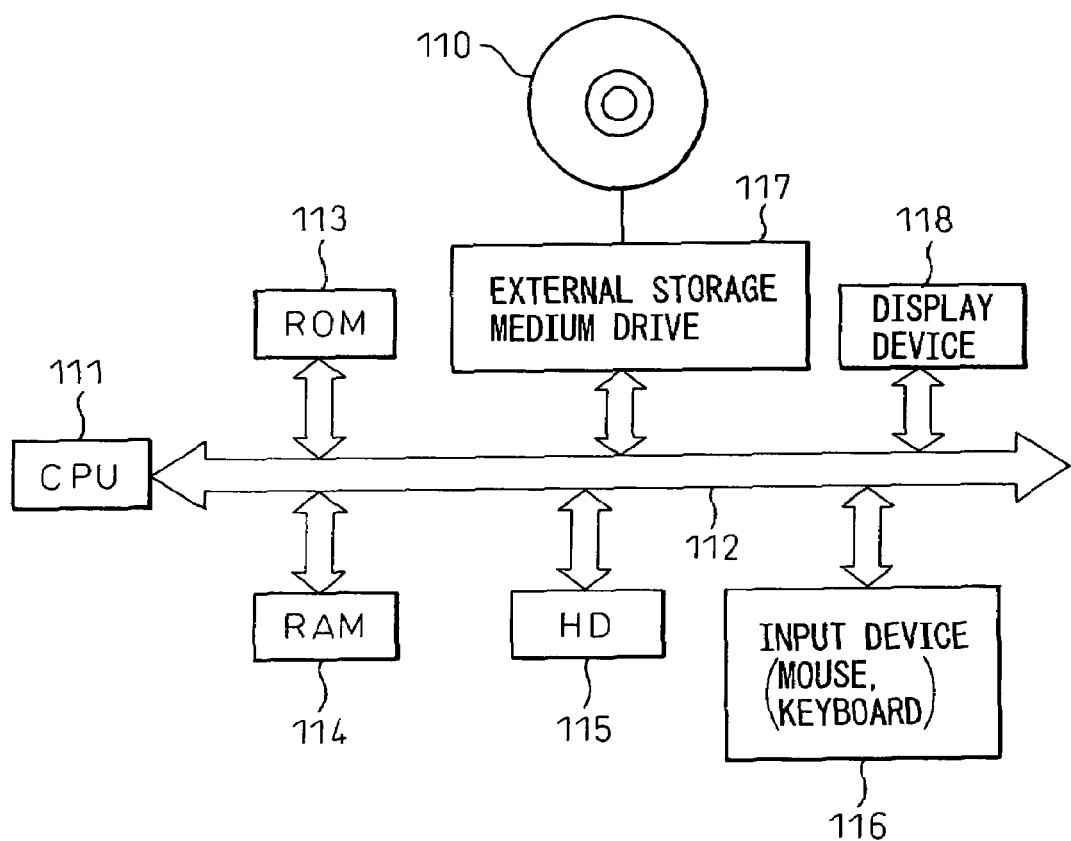
FIG. 24 is a block diagram showing a configuration of an automatic trace determination apparatus of an embodiment of the present invention that operates according to a program that is stored on a storage medium.

The automatic trace determination apparatus according to this embodiment as described above is implemented by using a computer. FIG. 24 is a block diagram showing a configuration of an automatic trace determination apparatus of an embodiment of the present invention that operates according to a program that is stored on a storage medium.

As shown in FIG. 24, a program for allowing a computer to perform automatic trace determination according to the present invention is stored on a storage medium (an external storage medium such as a flexible disk, a CD-ROM and the like) 110 and, for example, it is installed in a computer configured as described below to operate as an automatic trace determination apparatus.

A CPU 111 controls the automatic trace determination apparatus entirely. This CPU 111 is connected with a ROM 113, a RAM 114, a HD (hard disk drive) 115, an input device 116 such as a mouse, a keyboard and the like, an external storage medium drive 117, and a display device 118 such as a LCD, a CRT and the like through a bus 112. A control program for the CPU 111 is stored in the ROM 113.

The computer program for performing the automatic trace determination process according to the present invention (an automatic trace determination process program) is installed (stored) from the storage medium 110 on the HD 115. Further, in the RAM 114, a working area for the CPU 111 to perform the automatic trace determination process and an area for storing a portion of the automatic trace determination process program are secured. Moreover, in the HD 115, input data, final data and, further, an OS (operating system) and the like are stored in advance.

First, when the computer is turned on, the CPU 111 reads the control program from the ROM 110 and, further, reads the OS from the HD 115 to start the OS. As a result, the computer is ready to install the automatic trace determination program from the storage medium 110.

Next, the storage medium 110 is mounted on the external storage medium drive 117 and a control command is input from the input device 116 to the CPU 111 to read the automatic trace determination process program stored in the storage medium 110 and store it in the HD 115 and the like. Thus, the automatic trace determination process program is installed on the computer.

After that, once the automatic trace determination process program has been activated, the computer operates as the automatic trace determination apparatus. An operator can perform the automatic trace determination process described above by manipulating the input device 116 according to working details and procedures through an interaction indicated on the display device 118. "Data about optimal routes of traces" obtained as a result of the process may be, for example, stored on the HD 115 for utilization in the future, or the results of the process may be indicated on the display device 118 visually.

Here, though the program stored in the storage medium 110 is installed on the HD 115 in the computer of FIG. 24, the present invention is not limited to such implementation and the program may be installed on the computer through an information transmission medium such as a LAN and the like or the program may be installed in advance in the HD 115 built into the computer.

According to the present invention, an optimal position of a trace route that does not intersect with obstacles existing on a substrate can be determined automatically in a short time by computation using a computer and the like.

In particular, according to the present invention, a trace that can satisfy requirements for clearance and bypass obstacles can be designed by computation using a computer according to design rules without being restricted by shapes, disposed positions and angles and the like of the obstacles existing on a substrate. More specifically, according to the present invention, on a substrate where various obstacles exist, an optimal trace route that can satisfy requirements for clearance can be searched for automatically in a short time without being restricted by shapes and disposed positions and angles of the obstacles and regardless of angles, starting and ending positions of the trace intended to be provided. Therefore, to say nothing of in semiconductor integrated circuits such as LSIs and PCBs, in PBGA and EBGA semiconductor packages or in various circuit boards such as MCMs and SIPs, the present invention can determine trace routes that do not intersect with obstacles existing on a substrate.

In particular, when the present invention is applied to trace design of semiconductor packages, optimal trace routes can be readily designed in a short time without being influenced by the designer's skill, experience, intuition and the like, as in the related art, and, further, without being restricted by shapes, disposed positions and angles of obstacles existing on a substrate. For example, according to the present invention, the optimal trace routes, which were designed by taking more than ten hours of drawing operation in the related-art manual trace design by trial and error, can be designed automatically within about four hours or less. Because manual design work by trial and error as in the related art becomes unnecessary and, as a result, even if complicated trace routes are required or a large number of obstacles exist or the obstacles have complicated shapes, the optimal trace routes can be achieved in a short time. As a result of the reduction of design time and the burden on the designer, manufacturing costs of products can also be reduced. The optimal trace routes have shorter wiring length and, therefore, they can be more economical and they can be manufactured more easily and they have a lower rate of occurrence errors in the manufacturing process. Further, the optimal trace routes are also electrically stable.

What is claimed is:

1. An automatic trace determination apparatus for determining, on a substrate, a trace route that does not intersect with any obstacle on the substrate, automatically and by computation, comprising:

first candidate route setting means for, when an obstacle exists on a straight line connecting a starting point and an ending point of a trace, setting a plurality of straight routes originated from the starting point that are tangent to the obstacle as candidate starting routes and a plurality of straight routes originated from the ending point that are tangent to the obstacle as candidate ending routes, and for, when at least an additional obstacle exists on the straight line closer to the ending point, setting a plurality of straight routes originated from the ending point that are tangent to the additional obstacle as secondary candidate ending routes;

second candidate route setting means for, when the additional obstacle exists on the straight line, setting a plurality of straight routes each of which is tangent only to each of the obstacle and the additional obstacle and does not intersect with any other obstacle as candidate intermediate routes;

tentative route setting means for setting a plurality of tentative routes, each of which includes at least one of the candidate starting routes and one of the candidate ending routes when only the obstacle exists on the straight line, and, for setting a plurality of tentative routes, each of which includes at least one of the candidate starting routes, one of the secondary candidate ending routes and one of the candidate intermediate routes when the additional obstacle exists on the straight line; and optimal route determination means for, among the plurality of tentative routes, determining one of the plurality of tentative routes that has the shortest distance between the starting point and the end point as an optimal route.

2. The automatic trace determination apparatus according to claim 1, wherein, when the optimal route determined by said optimal route determination means intersects with an obstacle other than the obstacle bypassed by the optimal route, a point on the optimal route in a neighborhood of the obstacle bypassed by the optimal route is set as a new starting point of the trace to further perform processes by said first candidate route setting means, said second candidate route setting means, said tentative route setting means and said optimal route determination means.

3. The automatic trace determination apparatus according to claim 2, wherein the point on the optimal route in the neighborhood of the obstacle bypassed by the optimal route that is set as the new starting point of the trace is a point of contact between the optimal route and the obstacle concerned.

4. The automatic trace determination apparatus according to claim 1, further comprising decision means for deciding whether the obstacle exists or not on the straight line connecting the two points that are to be the starting point and the end point of the trace.

5. The automatic trace determination apparatus according to claim 1, further comprising clearance securing means for correcting the optimal route so that a clearance between the optimal route and the obstacle can be secured.

6. The automatic trace determination apparatus according to claim 1, wherein said first candidate route setting means sets, among the plurality of straight routes from the starting point that pass through vertexes of the obstacle having a polygonal shape, the plurality of straight routes that intersect with the obstacle only at the vertexes as the candidate starting routes and sets, among the plurality of straight routes from the end point that pass through vertexes of the obstacle, the plurality of straight routes that intersect with the obstacle only at the vertexes as the candidate ending routes, and said second candidate route setting means sets, among the plurality of straight routes that pass through vertexes of the two of the plurality of obstacles, the plurality of straight routes that intersect only with the two of the plurality of obstacles only at the vertexes as said candidate intermediate routes.

7. The automatic trace determination apparatus according to claim 6, wherein said second candidate route setting means has:

candidate tentative intermediate route setting means for setting, with respect to each of the two of the plurality of obstacles, among the plurality of straight routes that pass through vertexes of one of the plurality of obstacles from the other of the plurality of obstacles, the plurality of straight routes that intersect with the one of the plurality of obstacles only at the vertexes of such one of the plurality of obstacles as candidate tentative intermediate routes; and candidate intermediate route setting means for setting, among the candidate tentative intermediate routes, the plurality of candidate tentative intermediate routes that are drawn from both of the two of the plurality of obstacles as the candidate intermediate routes.

8. The automatic trace determination apparatus according to claim 7, wherein said candidate tentative intermediate route setting means does not include the plurality of straight routes from concave vertexes of the obstacle in the candidate tentative intermediate routes.

9. The automatic trace determination apparatus according to claim 6, wherein said first candidate route setting means sets the plurality of straight routes passing through the vertexes of the obstacle from the starting point that form the largest angles with an intersection check reference line, which is a straight line connecting between the starting point and the end point, as the candidate starting routes and sets the plurality of straight routes passing through the vertexes of the obstacle from the end point that form the largest angles with the intersection check reference line as the candidate ending routes.

10. An automatic trace determination apparatus for determining, on a substrate, a trace route that does not intersect with any obstacle on the substrate, automatically by computation, comprising:

virtual obstacle setting means for setting a virtual obstacle by enlarging an obstacle existing on a straight line connecting a starting point and an ending point of a trace to take a predetermined clearance into account;

first candidate route setting means for, when the virtual obstacle exists on the straight line, setting a plurality of straight routes originated from the starting point that are tangent to the virtual obstacle as candidate starting routes and a plurality of straight routes originated from the ending point that are tangent to the virtual obstacle as candidate ending routes, and for, when at least an additional obstacle exists on the straight line closer to the ending point, setting a plurality of straight routes originated from the ending point that are tangent to the additional obstacle as secondary candidate ending routes;

second candidate route setting means for, when the additional obstacle exists on the straight line, setting a plurality of straight routes each of which is tangent only to each of the obstacle and the additional obstacle and does not intersect with any other virtual obstacle as candidate intermediate routes;

tentative route setting means for setting a plurality of tentative routes, each of which includes at least one of the candidate starting routes and one of the candidate ending routes when only the obstacle exists on the straight line, and, for setting a plurality of tentative routes, each of which includes at least one of the candidate starting routes, one of the secondary candidate ending routes and one of the candidate intermediate routes when the additional obstacle exists on the straight line; and optimal route determination means for, among the plurality of tentative routes, determining one of the plurality of tentative routes that has the shortest distance between the starting point and the end point as an optimal route.

11. The automatic trace determination apparatus according to claim 10, wherein, when the optimal route determined by said optimal route determination means intersects with a new virtual obstacle other than the virtual obstacle bypassed by the optimal route, a point on the optimal route in the neighborhood of the virtual obstacle bypassed by the optimal route is set as a new starting point of the trace to further perform processes by said first candidate route setting means, said second candidate route setting means, said tentative route setting means and said optimal route determination means.

12. The automatic trace determination apparatus according to claim 11, wherein the point on the optimal route in the neighborhood of the virtual obstacle bypassed by the optimal route that is set as the new starting point of the trace is a point of contact between the optimal route and the virtual obstacle concerned.

13. The automatic trace determination apparatus according to claim 10, further comprising decision means for deciding whether the obstacle exists or not on the straight line connecting the two points that are to be the starting point and the end point of the trace.

14. The automatic trace determination apparatus according to claim 10, wherein said first candidate route setting means sets, among the plurality of straight routes from the starting point that pass through vertexes of the virtual obstacle having a polygonal shape, the straight routes that intersect with the virtual obstacle only at the vertexes as the candidate starting routes and sets, among the plurality of straight routes from the end point that pass through vertexes of the virtual obstacle, the straight routes that intersect with the virtual obstacle only at the vertexes as the candidate ending routes, and said second candidate route setting means sets, among the plurality of straight routes that pass through vertexes of two of the virtual obstacles, the straight routes that intersect only with the two of the plurality of virtual obstacles only at the vertexes as the candidate intermediate routes.

15. An automatic trace determination method for determining, on a substrate, a trace route that does not intersect with any obstacle on the substrate automatically by computation, the method comprising:

when an obstacle exists on a straight line connecting a starting point and an ending point of a trace, setting, by a first candidate route setting unit, a plurality of straight routes originated from the starting point that are tangent to the obstacle as candidate starting routes and setting a plurality of straight routes originated from the ending point that are tangent to the obstacle as candidate ending routes, and when at least an additional obstacle exists on the straight line closer to the ending point, setting, by the first candidate route a plurality of straight routes originated from the ending point that are tangent to the additional obstacle as secondary candidate ending routes;

when the additional obstacle exists on the straight line, setting, by a second candidate route setting unit, a plurality of straight routes each of which is tangent only to each of the obstacle and the additional obstacle and does not intersect with any other obstacle as candidate intermediate routes;

setting, by a tentative route setting unit, a plurality of tentative routes, each of which includes at least one of the candidate starting routes and one of the candidate ending routes when only the virtual obstacle exists on the straight line and, setting, by the tentative route setting a plurality of tentative routes, each of which includes at least one of the candidate starting routes, one of the secondary candidate ending routes and one of the candidate intermediate routes when the additional obstacle exists on the straight line; and determining, by an optimal route determination unit means, among the plurality of tentative routes, one of the plurality of tentative routes that has the shortest distance between the starting point and the end point as an optimal route.

16. The automatic trace determination method according to claim 15, wherein, when the determined optimal route intersects with a new obstacle other than said single obstacle bypassed by the optimal route, a point on the optimal route in the neighborhood of said single obstacle bypassed by the optimal route is set as a new starting point of the trace to further perform processes.

17. The automatic trace determination method according to claim 15, wherein the point of the optimal route in the neighborhood of said single obstacle bypassed by the optimal route that is set as the new starting point of the trace is a point of contact between the optimal route and the new obstacle concerned.

18. An automatic trace determination method for determining, on a substrate, a trace route that does not intersect with any obstacle on the substrate automatically by computation, the method comprising:

setting, by a virtual obstacle setting unit, a virtual obstacle by enlarging an obstacle existing on a straight line connecting a starting point and an ending point of a trace to take a predetermined clearance into account;

setting, by a first candidate route setting unit, a plurality of straight routes originated from the starting point that are tangent to the virtual obstacle as candidate starting routes and a plurality of straight routes originated from the ending point that are tangent to the virtual obstacle as candidate ending routes when the virtual obstacle exists on the straight line, and setting by the first candidate route, when an additional obstacle exists on the straight line closer to the ending point, a plurality of straight routes originated from the ending point that are tangent to the additional obstacle as secondary candidate ending routes;

when the additional obstacle exists on the straight line closer to the ending point, setting, by a second candidate route setting unit, a plurality of straight routes, each of which is tangent only to the virtual obstacle and the additional obstacle and does not intersect with any other virtual obstacle as candidate intermediate routes;

setting, by a tentative route setting unit, a plurality of tentative routes, each of which includes at least one of the candidate starting routes and one of the candidate ending routes and when only the virtual obstacle exists on the straight line, and setting, by the tentative route setting a plurality of tentative routes each of which includes at least one of the candidate starting routes, one of the secondary candidate ending routes and one of the candidate intermediate routes when the additional obstacle exists on the straight line; and determining, by an optimal route determination unit, among the plurality of tentative routes, one of the plurality of tentative routes that has the shortest distance between the starting point and the end point as an optimal route.

19. The automatic trace determination method according to claim 18, wherein, when said determined optimal route intersects with a virtual obstacle other than said virtual obstacle bypassed by such optimal route, a point on such optimal route in a neighborhood of said virtual obstacle bypassed by such optimal route is set as a new starting point of the trace to further perform said processes.

20. The automatic trace determination method according to claim 19, wherein the point of the optimal route in the neighborhood of said virtual obstacle bypassed by said optimal route that is set as said new starting point of the trace is a point of contact between the optimal route and the virtual obstacle concerned.

* * * * *